United States Patent [19]

Okamoto et al.

[11] 4,149,036
[45] Apr. 10, 1979

[54] CROSSTALK COMPENSATING CIRCUIT

[75] Inventors: Michio Okamoto; Shigetaka Washizawa; Osamu Kohsaka, all of Kawasaki, Japan

[73] Assignee: Nippon Columbia Kabushikikaisha, Tokyo, Japan

[21] Appl. No.: 792,788

[22] Filed: May 2, 1977

[30] Foreign Application Priority Data

May 19, 1976 [JP] Japan .............................. 51-62563[U]
Aug. 9, 1976 [JP] Japan ............................ 51-106290[U]
Aug. 9, 1976 [JP] Japan ............................ 51-106291[U]

[51] Int. Cl.² ............................................. H04H 5/00
[52] U.S. Cl. ................................. 179/15 BT; 179/1 G
[58] Field of Search .............. 179/15 BT, 1 G, 1 GQ, 179/100.1 TD, 100.4 ST

[56] References Cited

U.S. PATENT DOCUMENTS

| 3,068,323 | 12/1962 | Dome | 179/15 BT |
| 3,272,923 | 9/1966 | Csicsatka | 179/15 BT |
| 3,435,144 | 3/1969 | Csicsatka | 179/1 G |
| 3,943,293 | 3/1976 | Bailey | 179/15 BT |
| 3,944,748 | 3/1976 | Kuhn | 179/1 G |

Primary Examiner—Douglas W. Olms

[57] ABSTRACT

A crosstalk compensating circuit for use in stereo reproduction having a phase shifter or attenuator provided in each of plural signal transmission paths to adjust the amplitude and phase of an input channel signal and to add the adjusted channel signal to another channel signal, so that a crosstalk having any amplitude and phase between channels is compensated for.

7 Claims, 10 Drawing Figures

CROSSTALK COMPENSATING CIRCUIT

BACKGROUND OF THE INVENTION

1. Field of the Invention

The present invention relates generally to a crosstalk compensating circuit for the crosstalk among a plurality of signal transmission paths, and is directed more particularly to a crosstalk compensating circuit suitable for use in a stereo pickup cartridge, an FM stereo receiver a multi-channel tape recorder and so on.

2. Description of the Prior Art

Stereophonic reproduction of a sound signal may adversely be affected when crosstalk occurs from one channel to another channel. Crosstalk, may give rise, for example, to left and right expansions of a reproduced sound, localization of the reproduced sound and residual sound effects and may effect sharpness and brightness of the reproduced sound.

Prior art crosstalk compensating circuits for a stereophonic signal is disclosed in Japanese Utility Model Registration No. 590,061 entitled "Crosstalk adjusting apparatus for a stereophonic signal", the invention of which has been assigned to the assignee of the present application.

The above prior art crosstalk adjusting apparatus will be now described with reference to FIG. 1 which shows the adjusting apparatus schematically. With this prior art apparatus, the reverse phase sides of signal transmission paths R and L are coupled by a suitable impedance element Z and the other sides thereof are connected by a lead wire. In this case, if a crosstalk is given between the reverse phase sides of the signal transmission paths R and L, a sum signal $S = L + R$ (where L is the left signal and R the right signal) of the stereophonic signal decreases and its ratio to a difference signal $D = L - R$ also decreases to increase the stereophonic sense.

As noted above, prior art crosstalk compensating circuit, are designed on the assumption that the left and right crosstalk components are same in amplitude and polarity. Accordingly, adequate crosstalk compensation cannot be obtained if the left and right crosstalk components are different in amplitude and/or polarity and possibly also in phase.

One of the elements used in a stereophonic reproduction system which is apt to produce substantial crosstalk, is a mechanical-electrical transducer, i.e. pickup cartridge.

Measurements of crosstalk produced in the transducer, have shown that the amplitudes of the left and right crosstalk components are not always same. For example, when a changeable cartridge is attached to a support, such as a pickup arm, obliquely from its normal position, the geometric relation between the sound groove of a record disc and the signal-generation system of the pickup cartridge is adversely affected. In such case, if the above oblique or inclined angle is taken as $\theta$, a crosstalk corresponding to $\tan \theta$ is produced and an amplitude difference may thus exist between the left and right crosstalk components which exceeds 6 dB. In the most serious case, the left and right crosstalk components are of opposed polarity.

As to the phase of crosstalk components, it has been ascertained that the phase of crosstalk component of a cartridge whose separation is about 20 dB is about 0° or 180°, while that of a cartridge whose separation is about 30 dB is substantially ±90°. It will thus be apparent that the prior art crosstalk compensating circuit which presupposes crosstalk components of equal amplitude and polarity will not reduce crosstalk where the crosstalk components are of unequal amplitude and different polarity and possibly also of different phase.

OBJECTS AND SUMMARY OF THE INVENTION

Accordingly, it is an object of the present invention to provide a crosstalk compensating circuit for use in stereophonic reproduction free from the defects encountered in the prior art.

It is another object of the invention to provide a crosstalk compensating circuit for use in stereophonic reproduction which can compensate for crosstalks regardless of their amplitude and polarity.

It is a further object of the invention to provide a crosstalk compensating circuit for use in stereophonic reproduction which can compensate for crosstalk regardless of their amplitude and phase.

According to an aspect of the present invention there is provided a crosstalk compensating circuit for stereophonic reproduction which comprises a circuit provided in each of a plurality of signal transmission paths for level-adjusting a signal of each of said signal transmission paths at the same phase or reverse phase, and a circuit provided in each of said plural signal transmission path for adding a level-adjusted signal to another signal transmission path.

The other objects, features and advantages of the present invention will become apparent from the following description taken in conjunction with the accompanying drawings through which like reference numerals designate like elements.

DESCRIPTION OF THE PREFERRED EMBODIMENTS

The present invention will be hereinafter described with reference to the drawings.

Figure 1:
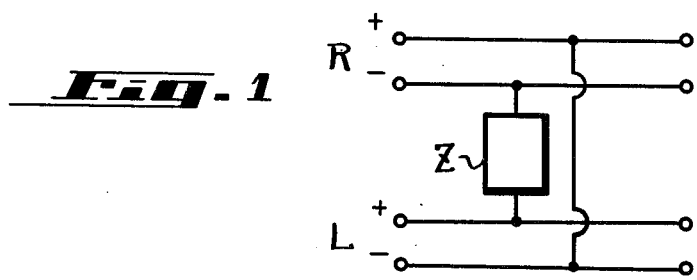
FIG. 1 is a schematic diagram showing a prior art crosstalk compensating circuit.
Figure 2:
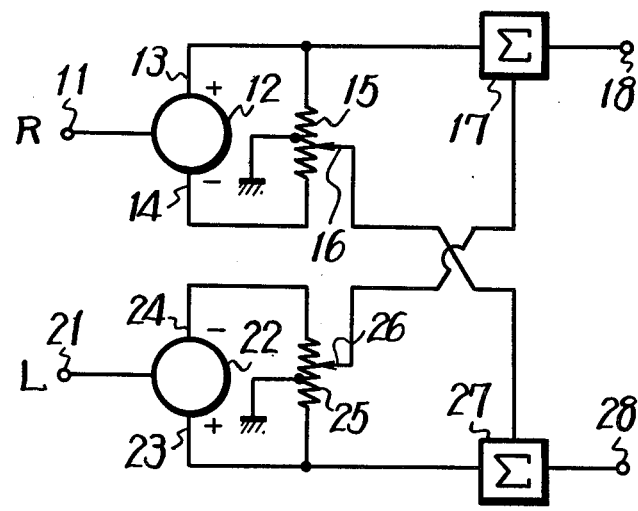
FIG. 2 is a circuit diagram showing an example of the crosstalk compensating circuit for use in stereophonic reproduction according to the present invention.

In FIG. 2 which shows a first example of the invention, an input terminal 11 of the right channel R is connected with a parallel phase circuit 12. A potentiometer 15, whose mid point is grounded, is connected in parallel to the parallel phase circuit 12. More specifically, the ends of the potentiometer 15 are connected to positive and negative polarity output terminals 13 and 14 of the parallel phase circuit 12, respectively. The positive polarity output terminal 13 of the parallel phase circuit 12 is also connected to an adding circuit 17 whose output side is connected to a right channel output terminal 18. A slider 16 of the potentiometer 15 is connected to an adding circuit 27 of the left channel L.

In the left channel L, similarly, an input terminal 21 thereof is connected with a parallel phase circuit 22, and a potentiometer 25 is connected, at its both ends, to positive and negative output terminals 23 and 24 of the parallel phase circuit 22, respectively. The positive output terminal 23 of the parallel phase circuit 22 is also connected to the left channel adding circuit 27 whose output side is connected to an output terminal 28. A slider 26 of the potentiometer 25 is connected to the right channel adding circuit 17 and the mid-point of the potentiometer 25 is grounded.

The parallel phase circuits indicated at 12, 22 in FIG. 2 and those later described produce two output signals or signals of positive and negative polarity and include a circuit element such as a transformer, and a polarity reversing means. With the circuit of FIG. 2, crosstalk compensation will occur whether the amplitudes of the two input signals are equal or not.

An input signal to the right channel R is converted into positive and negative signals by the parallel phase circuit 12, and the positive signal is supplied to the right channel adding circuit 17. As will be described later, the adjustable arm 16 of the potentiometer 15 is adjusted for contact with the potentiometer winding near the center of its range to provide a compensating signal having a polarity and amplitude such as to compensate for a crosstalk component. The compensating signal obtained at the slider 16 of the potentiometer 15 is fed to the left channel adding circuit 27 and then added to the left channel input signal therein to compensate for its crosstalk component.

In the left channel L, similar to the right channel R, a compensating signal obtained at the slider or arm 26 of the potentiometer 25 is fed to the right channel adding circuit 17 and then added to the right channel input signal therein to compensate for its crosstalk component.

It is assumed that the input signals to the left and right channels L and R, whose crosstalk components are different in amplitude and polarity, are taken as follows.

$$L + mR$$

$$R + nL$$

where $0 < |m|, |n| << 1$
and $m \neq n$

Under the above assumption, if compensating amounts are selected by elements 16 and 25 as $-m$ and $-n$, respectively, the output signals from the compensating circuit becomes as follows.

$$L + m \cdot R - m(R + nL) = L - m \cdot n \cdot L \doteq L$$

$$R + n \cdot L - n \cdot (L + mR) = R - n \cdot m \cdot R \doteq R$$

The above equations means that the crosstalks are sufficiently compensated for.

Figure 3A:
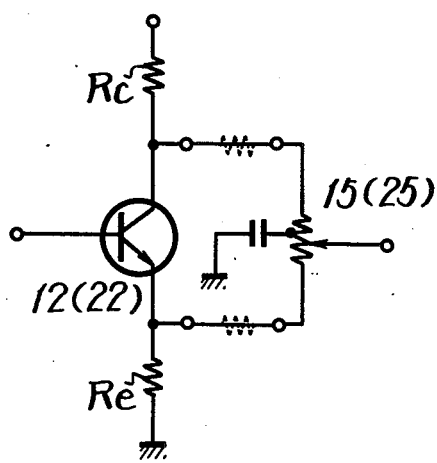
FIGS. 3A and 3B are connection diagrams showing practical example of a part of FIG. 2.

The parallel phase circuits 12 and 22 of example FIG. 2, may take the form of a well known emitter-collector type circuit shown in, for example, FIG. 3A. When the circuit shown in FIG. 3A is employed for purpose of the present invention, the resistance of resistor Re in series with the emitter is selected to be smaller than that of the collector resistor $R_c$.

Figure 3B:
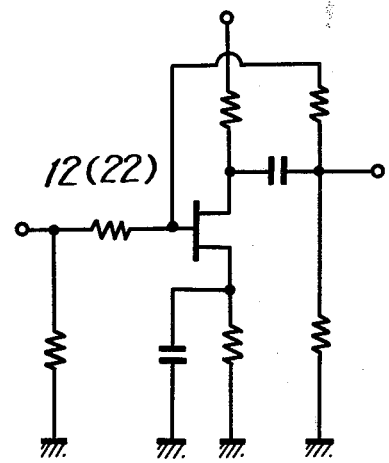

A polarity reversing circuit such as shown in FIG. 3B can be also used as the parallel phase circuits 12 and 22 of the present invention.

As described above, crosstalk can be compensated for in accordance with the principles of this invention regardless of the amplitudes and polarities of the input signals to the compensating circuits described.

As previously noted, when the cartridge whose separation is about 30 dB, the phase of the crosstalk component thereof is substantially ±90° with respect to the main signal, so that in order to compensate for such crosstalk a further improved compensation is required as will now be described with reference to the example of an improved compensating circuit shown in FIG. 4.

Figure 4:
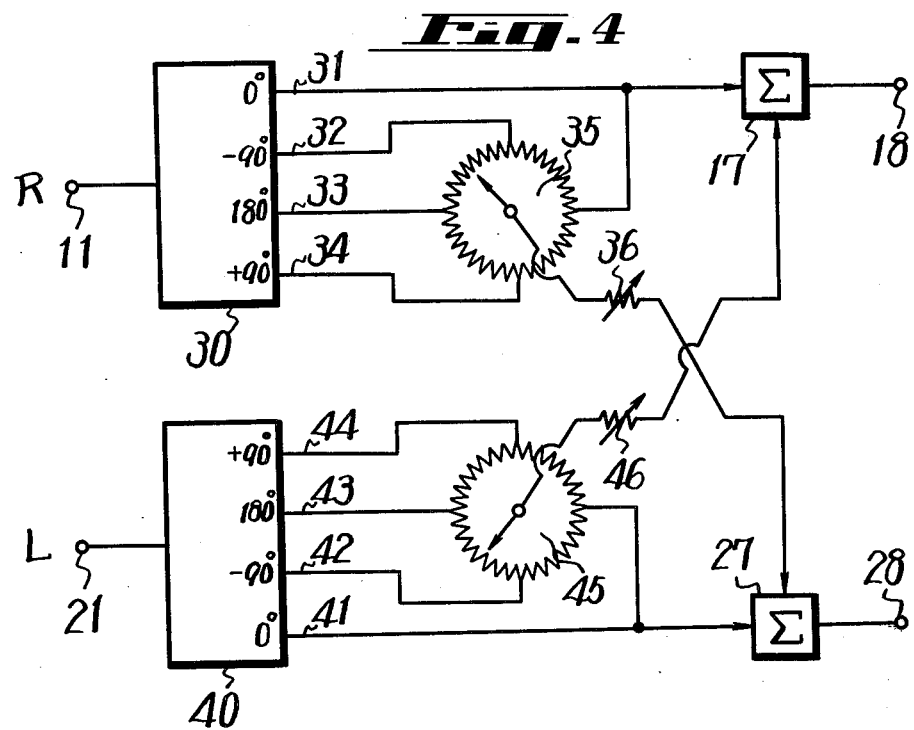
FIGS. 4, 6 and 7, inclusive, are circuit diagrams showing other example of the invention, respectively.

In the embodiment of the invention shown in FIG. 4, the input signals of the right and left channels R and L which contain crosstalk components are fed through the input terminals 11 and 21 to phase shifters 30 and 40 to be phase-shifted by 0°, ±90° and 180° as signals 31, 32, 33, 34 and signals 41, 42, 43, 44, respectively. The four phase-shifted signals 31 to 34 and 41 to 44 from the two phase shifters 30 and 40 are fed to four-input terminal potentiometers 35 and 45, respectively. The output signals 31 and 41 of 0° from the phase shifters 30 and 40 are also fed to the adding circuits 17 and 27, respectively. Output signals from the potentiometers 35 and 45 are fed through variable attenuators 36 and 46 to the adding circuits 27 and 17 of the reverse channels, respectively.

Figure 5:
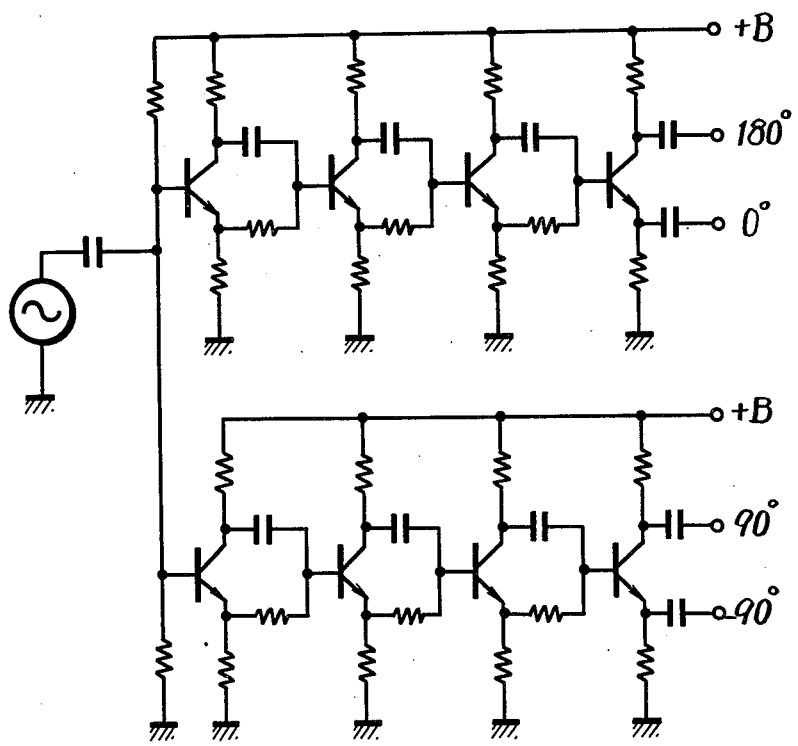
FIG. 5 is a connection diagram showing a practical example of the phase shifter used in the examples shown in FIGS. 4 and 6.

The phase shifters 30 and 40 produces signals of constant phase differences irrespective of the frequency of input signals thereto. An example of a suitable phase shifter is shown in FIG. 5.

Figure 6:
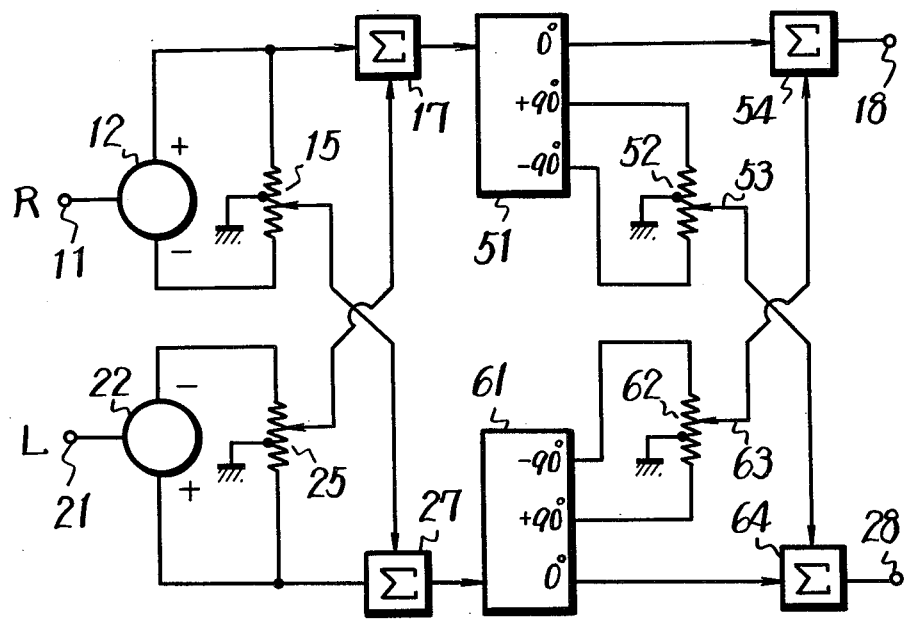

FIG. 6 is a connection diagram showing a further example of the present invention, which is formed by connecting circuits similar to that shown in FIG. 2 in cascade, so that the elements same as those used in FIG. 2 are marked with the same references and their description will be omitted for the sake of brevity.

In the example of FIG. 6, the output signals from the adding circuits 17 and 27 in the right and left channels R and L are fed to phase shifters 51 and 61 to be phase-shifted therein by 0° and ±90°, respectively. The output signals of ±90° from the phase shifters 51 and 61 are supplied to potentiometers 52 and 62, whose center taps are grounded, respectively, and the output signals of 0° from the phase shifters 51 and 61 are supplied to second adding circuits 54 and 64, respectively. Sliders or adjustable arms 53 and 63 of the potentiometers 52 and 62 are connected to the second adding circuits 64 and 54 of the opposite channels from which the output terminals 18 and 28 are led out.

Figure 7:
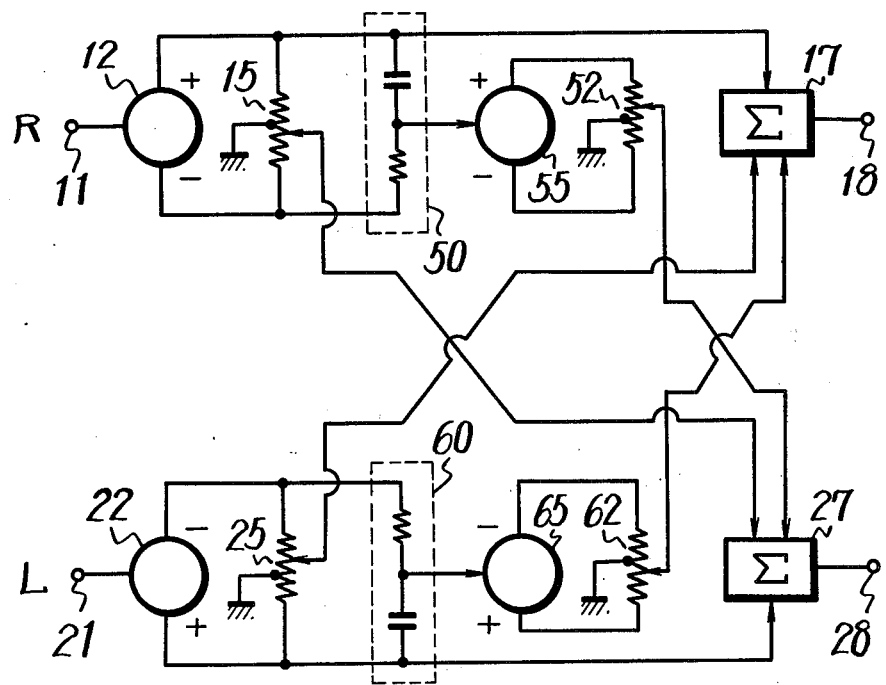

FIG. 7 is a simplified example of the present invention compared to that shown in FIG. 6. In the example shown in FIG. 7, phase shifter circuits 50 and 60, each of which consists of a capacitor and a resistor connected in series, and phase splitters 55 and 65 are used in place of the phase shifters 51 and 61 in the example of FIG. 6. And, in the example of FIG. 7 single adding circuits 17 and 27 are used in the right and left channels instead of those 17, 54 and 27, 64 in the example of FIG. 6.

If the crosstalk compensating circuit takes the form shown in FIGS. 4, 6 and 7, a compensating signal whose amplitude and phase are opposite to those of any crosstalk component can be obtained, to thereby eliminate crosstalk components which might otherwise exist.

Figure 8:
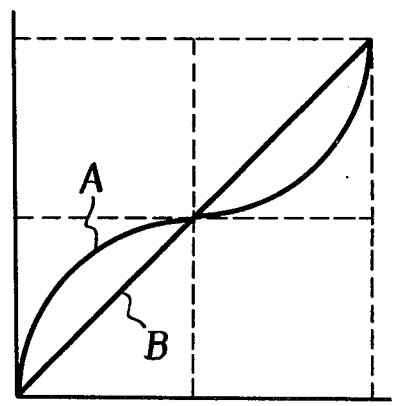
FIG. 8 is a graph showing the characteristics of a potentiometer used in the invention.

In general, because crosstalk signals are noticeably lower than the main signal level, it is preferred to position the slider of the potentiometer near the center of its range so that the resistance of the potentiometer may be varied gradually as shown by curve A in the graph of FIG. 8 rather than linearly as shown by the straight line B in FIG. 8 thereby permitting fine adjustment.

To ensure the desired fine adjustment both ends of the potentiometer are connected to the parallel phase circuit through suitable resistors, respectively, as shown by dotted lines in FIG. 3A.

The crosstalk compensating circuit of the present invention may be adjusted by means of a stereo disc record having signals recorded on the right and left walls of a sound groove formed therein. The right channel is adjusted to reproduce the signal on the right wall of the sound groove of the disc record and the right potentiometer (or attenuator) is adjusted to ensure minimal response to the crosstalk component in the left channel minimum while listening to the crosstalk component in the left channel. Similarly, the left channel is adjusted to reproduce the signal on the left wall of the sound groove is reproduced and the left potentiometer (or attenuator) is adjusted to ensure minimal response to the crosstalk component in the right channel minimum while listening to the crosstalk component in the right channel.

Figure 9:
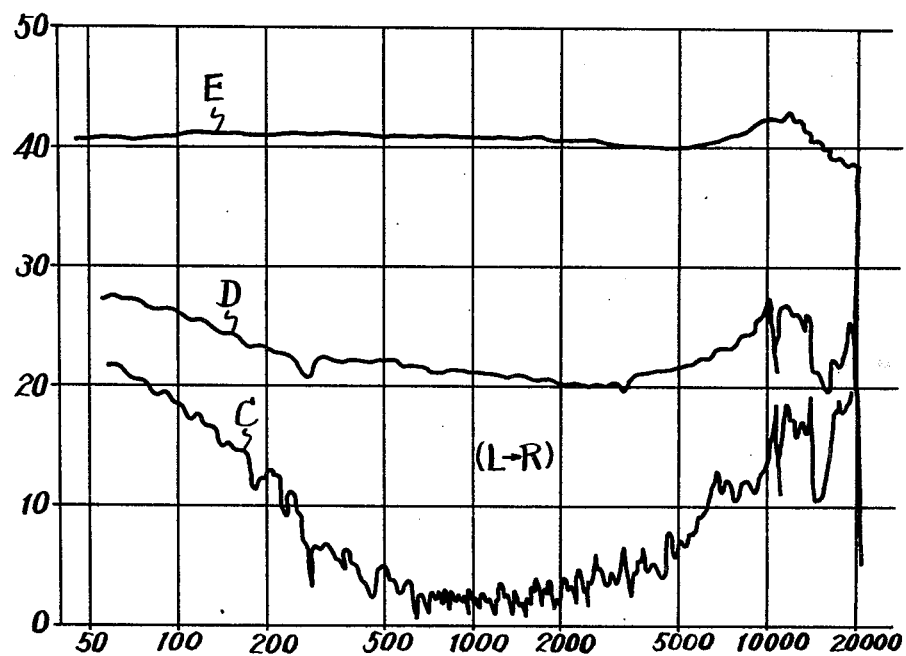
FIG. 9 is a graph used for explaining the effect of the invention.

The crosstalk compensating circuit of the present invention, as shown in the graph of FIG. 9 by a curve C, can compensate the crosstalk component up to about −40 dB in the mid frequency range. In the graph of FIG. 9, curve D illustrates the case where no compensation of the invention is carried out and a curve E shows the main signal of L channel.

As described above, the crosstalk compensating circuit of the present invention can compensate for any crosstalk component regardless of its amplitude and phase, so that in a reproduced sound field the localization of respective musical instruments becomes positive and the reproduced sound becomes vivid and bright and of substantial volume and thus the quality of the reproduced sound is much improved.

It may be apparent that many modifications and variations could be effected by one skilled in the art without departing from the spirits or scope of the novel concepts of the present invention so that the scope of the invention should be determined by the appended claims.

We claim as our invention:

1. A crosstalk compensating circuit having at least first and second signal transmission paths, said first transmission path receiving crosstalk signal components from said second transmission path and vice versa, said compensating circuit, for minimizing distortion occasioned by crosstalk signal components of different amplitude and polarity in said transmission paths, comprising in each said transmission path at least parallel connected electrical circuit components having an input and an output and an adding circuit connected to the output of the parallel connected electrical circuit components, one component of said parallel connected electrical components in each transmission path comprising adjustable means providing an adjustable compensating voltage connected to the adding circuit of the other transmission path, of a magnitude and polarity to compensate for crosstalk signal components therein.

2. A circuit according to claim 1, wherein said adjustable means in each transmission path is a potentiometer grounded at its midpoint and having an adjustable arm connected to the adding circuit in the other transmission path.

3. A circuit according to claim 1, wherein the output supplied to the adding circuit in said first transmission path is R + nL, and the compensating voltage to the adding circuit in the first transmission path supplied by the adjustable means in the second path is −n(L + mR) where L and R are electrical signals derived from left and right channels of a stereo system and nL and mR are the crosstalk signal components in the right and left transmission paths from the left and right transmission paths respectively, where $0 < |m|$ and $n << 1$ and where m and n are equal.

4. A circuit according to claim 3, wherein phase shift means is provided in each channel to shift the phase of the electrical signals therein prior to supply to said input of said parallel connected electrical circuit components.

5. A circuit according to claim 3, wherein each channel includes (a) phase shift means connected to the output of the adding circuit therein for shifting the phase of the adding circuit output 0°, + 90° or −90°, (b) a potentiometer connected to said phase shift means for supply thereby of signals shifted ± 90°, and (c) an additional adding circuit connected to the phase shift means for supply thereby of signals shifted 0°, each said additional adding circuit being also supplied with a selectable voltage from the potentiometer in the other transmission path.

6. A crosstalk compensating circuit having at least two different signal transmission paths comprising in each signal transmission path (a) circuit means for providing electrical signals at a plurality of output terminals, (b) control means connected to said circuit means between said plural output terminals for continuously controlling the amplitude and phase of its output signal by selecting one of the electrical signals from said circuit means, and (c) adder means for adding electrical signals supplied thereto, the adder means in each signal transmission path being supplied with electrical signals from the circuit means of its transmission path and with electrical signals from said control means of the other signal transmission path.

7. A crosstalk compensating circuit having at least two different signal transmission paths, each of said at least two different signal transmission paths comprising (a) first circuit means for providing an electrical signal at an output terminal, (b) first adjustable control means supplied with said output signal for adjustably controlling the amplitude of said electrical signal from said first circuit means, (c) second circuit means for phase shifting the phase of the electrical signal from the first circuit means to provide signals which are in equalphase and of opposite phase, (d) second control means operatively connected to said second circuit means for selecting one of said phase shifted signals and continuously controlling the amplitude of the selected signal from said second circuit means; and (e) electrical signal adder means for adding the electrical signals supplied thereto, said electrical signal adder means in each signal transmission path being supplied with the amplitude controlled electrical signal from the first and second control means of the other signal transmission path and with the electrical signals from said first circuit means in its own transmission path.

* * * * *